United States Patent
Fan et al.

(10) Patent No.: US 10,615,027 B1
(45) Date of Patent: Apr. 7, 2020

(54) STACK VIABAR STRUCTURES

(71) Applicant: International Business Machines Corporation, Armonk, NY (US)

(72) Inventors: Su Chen Fan, Cohoes, NY (US); Hsueh-Chung Chen, Cohoes, NY (US); Yann Mignot, Slingerlands, NY (US); James J. Kelly, Schenectady, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/170,465

(22) Filed: Oct. 25, 2018

(51) Int. Cl.
| | |
|---|---|
| *H01L 21/3213* | (2006.01) |
| *H01L 21/02* | (2006.01) |
| *H01L 21/768* | (2006.01) |
| *H01L 25/07* | (2006.01) |

(52) U.S. Cl.
CPC .... *H01L 21/02244* (2013.01); *H01L 21/3213* (2013.01); *H01L 21/76879* (2013.01); *H01L 25/074* (2013.01)

(58) Field of Classification Search
CPC ......... H01L 21/02244; H01L 21/76879; H01L 21/3213
See application file for complete search history.

(56) References Cited

U.S. PATENT DOCUMENTS

| | | | |
|---|---|---|---|
| 8,115,276 B2 | 2/2012 | Zhang et al. |
| 8,881,083 B1 | 11/2014 | Deng et al. |
| 9,087,906 B2 | 7/2015 | Verma et al. |
| 9,189,589 B2 | 11/2015 | Muddu et al. |
| 9,679,805 B2 | 6/2017 | Bouche et al. |
| 9,679,841 B2 | 6/2017 | Jomaa et al. |
| 9,805,972 B1 | 10/2017 | Zhang et al. |
| 9,859,161 B2 | 1/2018 | Boemmels et al. |
| 9,997,456 B2 | 6/2018 | Kaltalioglu et al. |
| 2005/0041405 A1 | 2/2005 | Kawagoe |
| 2016/0379929 A1 | 12/2016 | Feurprier et al. |
| 2017/0294347 A1 | 10/2017 | Chi et al. |
| 2018/0148329 A1 | 5/2018 | Michalik et al. |

*Primary Examiner* — Douglas M Menz
(74) *Attorney, Agent, or Firm* — Fleit Intellectual Property Law; Jose Gutman

(57) ABSTRACT

Various methods and structures for fabricating a semiconductor structure. The semiconductor structure includes in a top layer of a semiconductor stack a semiconductor contact located according to a first horizontal pitch. A first metallization layer is disposed directly on the top layer and includes a metallization contact located according to a second horizontal pitch, the second horizontal pitch being different from the first horizontal pitch such that the location of the metallization contact is vertically mismatched from the location of the semiconductor contact. A second metallization layer is disposed directly on the first metallization layer. The second metallization layer includes a super viabar structure that forms an electrical interconnect, in the second metallization layer, between the semiconductor contact in the top layer of the semiconductor stack and the metallization contact in the first metallization layer.

20 Claims, 15 Drawing Sheets

STACK VIABAR STRUCTURES

BACKGROUND

The present invention generally relates to the field of semiconductors, and more particularly relates to a method of fabricating metallization structures, BEOL metallization layers, and the like, on semiconductor substrates.

Semiconductor wafers, chips, devices, and the like, whether including analog or digital electronic circuits, typically rely on at least one metallization layer disposed on a semiconductor substrate to provide electronic interconnections between circuits on the semiconductor substrate or layer. Some circuit designs use a plurality of metallization layers stacked on top of one another. A metallization layer may also be referred to as a back-end-of-line (BEOL) metallization layer which could be disposed on a semiconductor material stack. Semiconductor contacts in a top layer in the semiconductor material stack are electrically connected to metal contacts and metal interconnects in a metallization layer disposed on the semiconductor material stack.

As chip designs continue to miniaturize on-chip electronic device dimensions to increase feature density, such chip designs attempt to locate electronic devices, and accordingly device features, closer and closer to each other on a semiconductor chip. As device features are located closer to each other, the respective metal interconnection wires are smaller widths and separated from each other by smaller pitch values and tighter pitch tolerances (pitch variability), to meet chip design requirements. As pitch values between adjacent features become much smaller with tighter pitch tolerances, conventional metal interconnection wires and contacts experience fabrication processing problems to meet the smaller metal interconnection wire widths, smaller metal contacts, and tighter pitch requirements. These fabrication processing problems can be magnified when a semiconductor stack design electrically interconnects metal contacts in a metallization layer with semiconductor contacts in a semiconductor layer. Scaling circuit designs to smaller physical layouts is getting more difficult because of the conflict between design requirements and layout restrictions at the contact and local interconnected level. These types of limitations of metal interconnection wire and electrical contact design, at continuously smaller scale circuit designs, have created a challenge for circuit designers and for semiconductor fabrication process designers to continue to meet further miniaturization goals. In order to resolve such difficulties and limitations, new semiconductor fabrication process elements and semiconductor structures will be required.

SUMMARY OF THE INVENTION

Various embodiments of the present invention include fabrication of semiconductor structures comprising: a semiconductor stack disposed on a substrate, a top layer of the semiconductor stack including a semiconductor contact located in the top layer of the semiconductor stack according to a first horizontal pitch. A first BEOL metallization layer is disposed directly on the top layer of the semiconductor stack including a metallization contact located in the first BEOL metallization layer according to a second horizontal pitch, the second horizontal pitch being different from the first horizontal pitch such that the location of the metallization contact is vertically mismatched from the location of the semiconductor contact. A second BEOL metallization layer is disposed directly on the first BEOL metallization layer. The second BEOL metallization layer includes a super viabar structure that forms an electrical interconnect, in the second BEOL metallization layer, between the at least one semiconductor contact and the at least one metallization contact.

According to certain embodiments of the invention, the super viabar structure in the second BEOL metallization layer provides a modular add-on electrical interconnect on top of the first BEOL metallization layer. The super viabar structure interconnects the vertically mismatched metallization contact in the first BEOL metallization layer with the semiconductor contact in the top layer of the semiconductor stack.

A semiconductor fabrication method and semiconductor structure, for example, can form a plurality of back-end-of-line (BEOL) metallization layers on a semiconductor stack, on a semiconductor chip. A super via bar is formed in a second BEOL metallization layer disposed directly on a first BEOL metallization layer. The super viabar structure forms an electrical interconnect, in the second BEOL metallization layer, between a semiconductor contact in a top layer of the semiconductor stack and a metallization contact in the first BEOL metallization layer.

According to various embodiments, provided is a method for fabricating an electrical contact in a BEOL metallization layer for a semiconductor structure, the method comprising: providing a semiconductor stack disposed on a circuit supporting substrate; patterning a top layer of the semiconductor stack to provide at least one semiconductor contact located in the top layer of the semiconductor stack according to a first horizontal pitch; patterning a first BEOL metallization layer disposed directly on the top layer of the semiconductor stack, to provide at least one metallization contact located in the first BEOL metallization layer according to a second horizontal pitch, the second horizontal pitch being different from the first horizontal pitch such that the location of the at least one metallization contact is vertically mismatched from the location of the at least one semiconductor contact; and patterning a second BEOL metallization layer disposed directly on the first BEOL metallization layer, followed by deposition of a metal fill material filling a via trench in the first BEOL metallization layer and the second BEOL metallization layer, to provide a super viabar structure that forms an electrical interconnect, in the second BEOL metallization layer, between the at least one semiconductor contact in the top layer of the semiconductor stack and the at least one metallization contact in the first BEOL metallization layer.

In certain embodiments, the super viabar structure is formed in the second BEOL metallization layer as a modular add-on electrical interconnect on top of the first BEOL metallization layer, for interconnecting the vertically mismatched at least one metallization contact in the first BEOL metallization layer with the at least one semiconductor contact in the top layer of the semiconductor stack.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
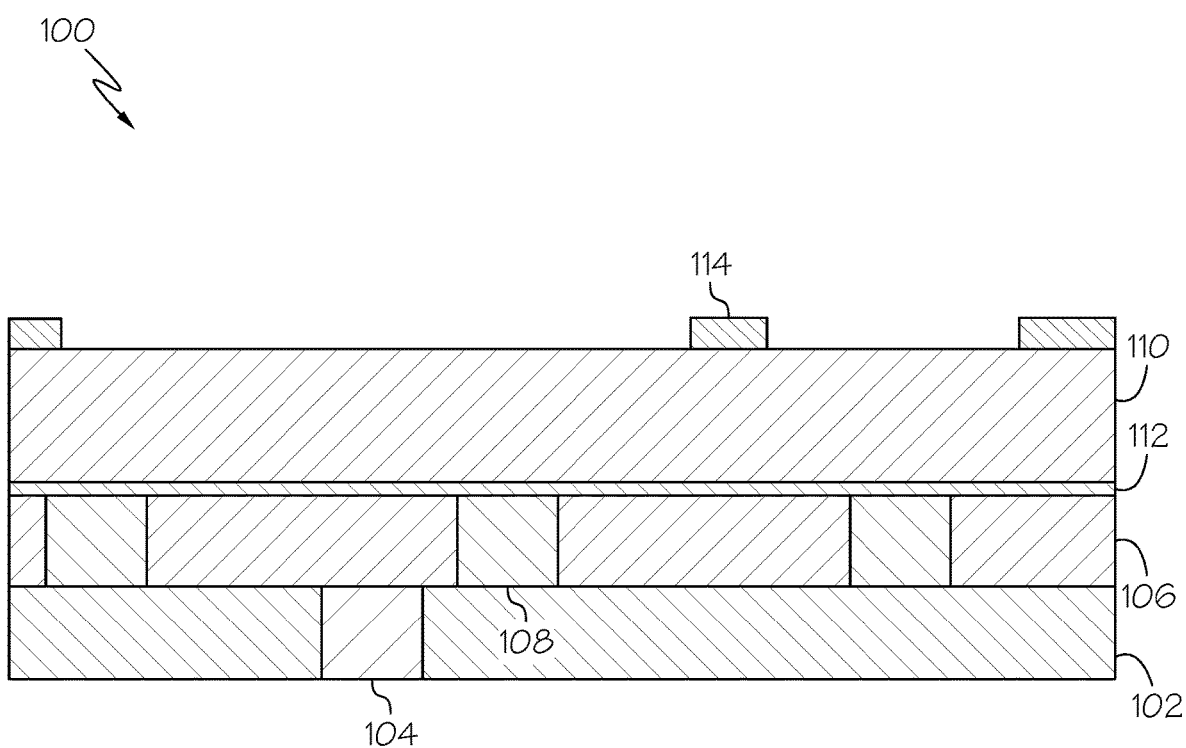
FIG. 1 is a cross-sectional side view of an example of a partial semiconductor structure illustrating a material stack that can be used in an example fabrication process, according to various embodiments of the invention.

It is to be understood that the present invention will be described in terms of illustrative example processes for fabricating semiconductor structures and metallization layers in semiconductor chips and wafers. However, many other semiconductor architectures, structures, substrate materials, and process features and steps may be varied within the scope of the present invention.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. Such integrated circuit chips can include analog circuits and devices, digital circuits and devices, or any combination of analog and digital circuits and devices. Such integrated circuit chips may exist in many different embodiments. For example, integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, discrete semiconductor electronic devices, or other signal processing devices, or any combination thereof, as part of either (a) an intermediate product, such as a motherboard or component module, or (b) an end product. The end product can be any product that includes semiconductor integrated circuits and/or CMOS integrated circuits, ranging from toys and other low-end applications to advanced computer products and mobile phone devices having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use analog circuits, CMOSs, MOSFETs and/or finFETs technology. By way of non-limiting example, the semiconductor devices can include, but are not limited to analog, CMOS, MOSFET, and finFET devices, and/or semiconductor devices that use analog circuits, CMOS, MOSFET and/or finFET technology.

As used herein, "vertical" refers to a direction perpendicular to a substrate in the cross-sectional and three-dimensional views herein. Current between electronic contacts, whether semiconductor or metal contacts, may be described herein as flowing in a vertical direction (e.g., between a bottom contact or layer and a top contact or layer) through metal interconnection wire. As used herein, "horizontal" refers to a direction parallel to a substrate in the cross-sectional and three-dimensional views herein.

As used herein, "thickness", "thick", or the like, refers to a size of an element (e.g., a layer, trench, via hole, etc.) in the cross-sectional views measured from a bottom surface to a top surface, or from a left side surface to a right side surface of the element, and/or measured with respect to a surface directly adjacent to and contacting the element (e.g., a surface on which the element is directly disposed on).

Unless otherwise specified, as used herein, "height" or "height above a substrate" refers to a vertical size of an element (e.g., a layer, trench, via hole, etc.) in the cross-sectional views measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

A viabar structure, as used herein, is defined as a generally rectangular electrical wire structure (that may be also referred to as an electrical interconnect or an electrical junction) typically extending horizontally across one metallization layer in a semiconductor structure and extending vertically across two or more layers in a material stack in the semiconductor structure. A super viabar structure, as used herein, means a viabar structure extending horizontally across a metallization layer that is disposed on top of two or more layers in a material stack in a semiconductor structure in which the super viabar structure is extending vertically across the two or more layers in the material stack in the semiconductor structure. The super viabar structure provides an electrical interconnect or an electrical junction between features in the two or more layers in the material stack in the semiconductor structure.

The inventors have discovered that use of a super viabar structure, such as in a second metallization layer on top of a first metallization layer that is disposed on a top layer of a semiconductor stack, can provide electrical interconnection for a metallization contact in the first metallization layer that is vertically mismatched (vertically offset) with a semiconductor contact (which may also be referred to as a semiconductor pad, a pad, or the like) in the top layer of the semiconductor stack. The vertical offset, for example, may be implemented by design, where the super viabar structure provides the electrical interconnection between features in the first metallization layer and in the top layer of the semiconductor stack.

According to a second example, the metallization contact in the first metallization layer and the semiconductor contact in the top layer of the semiconductor stack can be designed to be vertically matched (vertically coincident) and electrically contacting one another—one directly on top of the other in a material stack. However, due to pitch variability and fabrication processing variability in each of the layers in the material stack, the metallization contact in the first metallization layer can become vertically mismatched (vertically offset) with the semiconductor contact in the top layer of the semiconductor stack. This vertical mismatch can occur, for example, because pitch values for a design become much smaller with tighter pitch tolerances between features in each of the several layers on top of each other in a material stack. The pitch variability of features, intended to be vertically matched, in each of the several layers can result in a first feature in a first layer in a material stack to be vertically mismatched with a second feature in a second layer in the material stack.

A super viabar structure, according to various embodiments of the invention, can be formed in a second metallization layer as a modular add-on electrical interconnect on top of the first metallization layer to provide an electrical interconnect between the vertically mismatched electrical contacts in the separate layers in the material stack. The super viabar structure, as will be discussed below in more detail, provides electrical interconnect, in the second metallization layer, between a metallization contact in the first metallization layer and a semiconductor contact in a top layer of a semiconductor stack below the first metallization layer. The metallization contact in the first metallization layer is vertically mismatched (vertically offset) with the semiconductor contact in the top layer of the semiconductor stack.

It should be noted that semiconductor circuit designs and physical layouts can include a plurality of metallization layers stacked on top of one another in a material stack. A metallization layer may also be referred to as a back-end-of-line (BEOL) metallization layer, which could be disposed on top of a semiconductor material stack.

Various types of conductive materials and/or metals can be used, in various embodiments of the invention, such as in: electrical contacts, a super viabar structure, and metal wiring, according to various circuit design and layout implementation goals and requirements. Copper and Tungsten metals have been popularly used for circuit implementations. While Copper has been used and continues to be used in many semiconductor circuit design implementations, Cobalt has certain advantages as the pitch values become much smaller with tighter pitch tolerances between features in each of several layers on top of each other in a material stack. The inventors have discovered that reliability of a semiconductor fabrication process can be significantly increased by replacing with Cobalt metal wires and electronic junctions (e.g., a metal contact) the previously popular Copper metal wires and electronic junctions, at least at lower metallization layers near a top layer in a semiconductor stack. For example, Cobalt wiring has a higher melting point than Copper wiring. Cobalt wiring has a higher electro-migration resistance than Copper wiring. Cobalt wiring is therefore easier to use and more reliable to use than Copper, in a semiconductor fabrication process as the scale of circuit designs continue to shrink, such as using wire widths below twenty five nanometers. Accordingly, in some embodiments Cobalt metal may be used in any one or more of the following example structures: semiconductor contacts in a semiconductor layer, metallization contacts in a metallization layer, metallization wires in a metallization layer, and in a super via bar interconnect structure in a metallization layer. As the scale of circuit designs continue to shrink, the inventors have found that another useful metal for certain circuit implementations is Ruthenium. Various embodiments, therefore, may use any combination of conductive materials and/or metals, such as Copper, Tungsten, Cobalt, or Ruthenium, or other conductive materials, in any one or more of the example structures listed above.

The width of such Cobalt wiring in an electrical junction, for example, can be twenty five nanometers or less. The electrical junction is in direct connection with a semiconductor circuit contact or pad in the semiconductor stack. Electrical signals can be coupled through this electrical junction between a metallization layer wiring and miniaturized electronic circuits in a semiconductor stack disposed under the metallization layer.

The use of Cobalt as a conductor material in such metallization layer wiring, however, can create certain challenges to a product design, which the inventors have overcome with various embodiments of the present invention as will be discussed below. Cobalt metal, for example, can be more reactive than Copper metal. Consequently, Cobalt atoms can migrate to adjacent dielectric material more readily than Copper. Cobalt wiring oxidizes and corrodes faster and can be damaged more quickly than Copper wiring during a fabrication process.

To mitigate at least the problems mentioned above, while scaling continuously smaller semiconductor circuit lines to continue to meet further circuit miniaturization goals, the inventors propose to use, in certain embodiments, a metal cap formed on an electrical contact in an electrical junction in a metallization layer and/or a metal cap formed on a semiconductor contact in a top layer of the semiconductor stack. The metal cap would be made with a non-Cobalt metal material. Such a metal cap can be formed on a top surface region of the electrical contact that could be made of Cobalt and/or another metal. In certain embodiments, the metal cap can be made with a metal species that is more noble (less reactive) than Cobalt metal. The metal species, obviously, would be a metal that is other than Cobalt metal. Examples of metal species more noble (less reactive) than Cobalt include, but are not limited to: Copper, Ruthenium, Rhodium, Platinum, Iridium, Osmium, Palladium, or Rhenium. Examples of the novel semiconductor fabrication process will be discussed in more detail below.

Referring now to the drawings in which like numerals represent the same or similar elements, a first example semiconductor fabrication process generally corresponds to the process steps shown in FIGS. 1 to 6. In this first example fabrication process a semiconductor structure 100 comprises a semiconductor stack disposed on a semiconductor substrate, the top layer 102 of the semiconductor stack is shown in FIG. 1. However, it should be clear that a semiconductor structure 100 can include any combination of the top layer 102 of the semiconductor stack, with one or more layers in the semiconductor stack disposed directly below the top layer 102 and a semiconductor substrate supporting the semiconductor stack. The semiconductor substrate can additionally be supporting electronic circuits.

According to various embodiments, the substrate may comprise a circuit supporting substrate. A plurality of electronic devices is disposed on the circuit supporting substrate. A first electronic device in the plurality of electronic devices, for example, comprises a first field-effect transistor (FET) and a second electronic device in the plurality of electronic devices comprises a second FET. According to various embodiments of the present invention, an electrical interconnect in a metallization layer on the circuit supporting substrate provides a conductive path for coupling electrical signals between the first FET and the second FET.

The semiconductor structure 100 includes a metallization material stack that includes a first metallization layer 106 (which may also be referred to as a bottom metallization layer) disposed directly on the top layer 102 of the semiconductor stack. The metallization material stack also includes a second metallization layer 110 (which in certain embodiments may also be referred to as a top metallization layer) disposed on the first metallization layer 106. It should be noted that while the metallization material stack can include the second metallization layer 110 disposed directly on the first metallization layer 106, in various embodiments the metallization material stack could include one or more intervening metallization layers between the first and second metallization layers 106, 110. That is, the second metallization layer 110 would be disposed on one or more intervening metallization layers, which would be disposed on the first metallization layer 106.

As illustrated in FIG. 1, a dielectric insulating layer 112 (also referred to as a dielectric cap layer) can be part of the second metallization layer 110 as shown. The dielectric cap layer 112 can be used to separate at least some metal wiring, circuits, and junctions, in the second metallization layer 110 from making direct electrical contact with metal wiring, circuits, and junctions, in the first metallization layer 106. The dielectric cap layer 112 would be removed at selected locations to allow electrical interconnection, e.g., wiring and junctions, to extend from the second metallization layer 110 down to the first metallization layer 106 and/or further below to the top layer 102 of the semiconductor stack. The dielectric cap layer 112 may include, for example, dielectric material such as silicon oxide or carbon-doped oxide, or other low K dielectrics. Various dielectric materials may be used for the dielectric cap layer 112, according to various embodiments of the present invention.

A semiconductor contact 104 in the top layer 102 of the semiconductor stack is laid out along with other features in the top layer 102 according to a first horizontal pitch. The semiconductor contact 104 in this example can be made of Tungsten or Copper. A metallization contact 108 is laid out along with other features in the first metallization layer according to a second horizontal pitch. The metallization contact 108 in this example can be made of Tungsten or Copper. The second horizontal pitch is different from the first horizontal pitch such that the location of the metallization contact 108 in the first metallization layer is vertically offset (vertically mismatched) from the location of the semiconductor contact 104 in the top layer 102. A hard mask 114 is disposed on the second metallization layer 110 such that it creates a boundary for an etching process, as will be discussed in more detail below.

Figure 2:
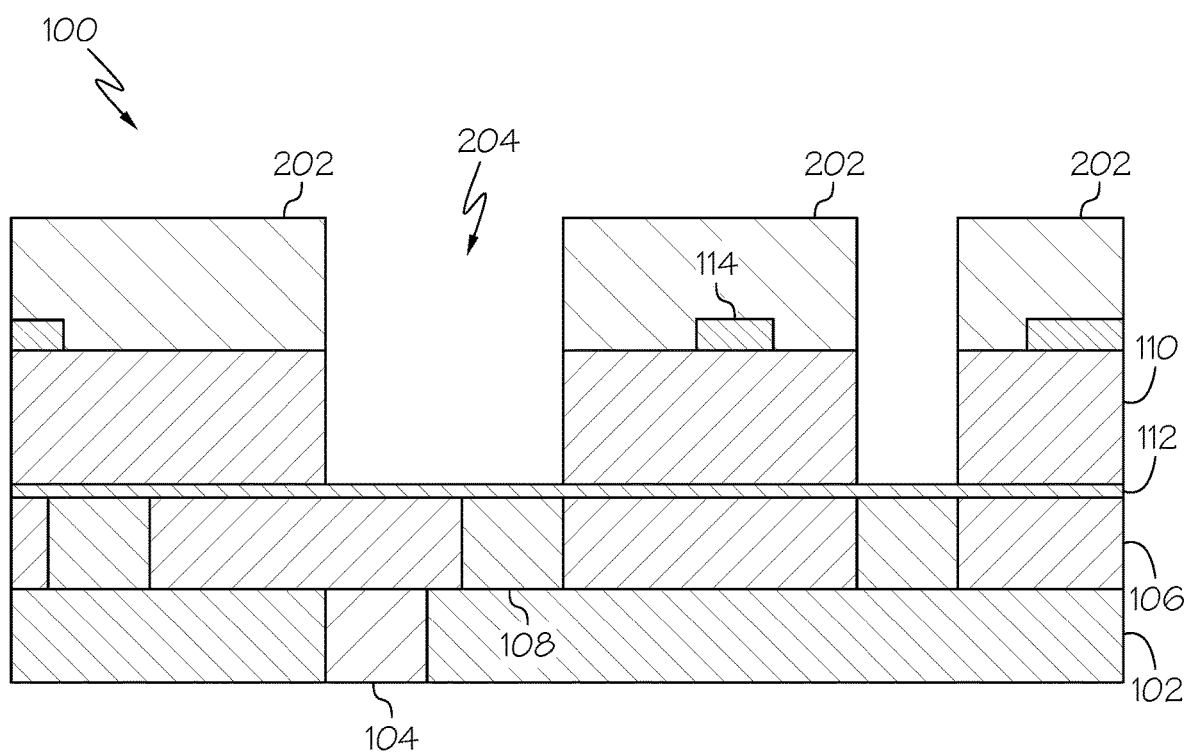
FIG. 2 is a cross-sectional side view of the partial semiconductor structure of FIG. 1 at a subsequent point in the example fabrication process.

Referring to FIG. 2, a semiconductor fabrication process, according to the present example, forms an etching patterning mask layer 202 on top of the second metallization layer. The etching patterning mask layer 202 can comprise a photolithography material stack OPL layer 202. The opening in the etching patterning mask layer 202 provides a guide for via patterning of a via trench 204 as shown. The via trench 204 can be formed by vertical directional etching such as using a reactive ion etching (RIE) process that etches through the second metallization layer 110 down through the dielectric cap layer 112 and exposes the first metallization layer 106 at the metallization contact 108. An example of a reactive ion etching (RIE) uses a fluoride based chemistry (for example, the chemistry could include mixtures of Ar, $CHF_3$, $C_4F_8$ and $CF_4$, etc.). However, there are many alternative vertical etching processes that could be used.

Figure 3:
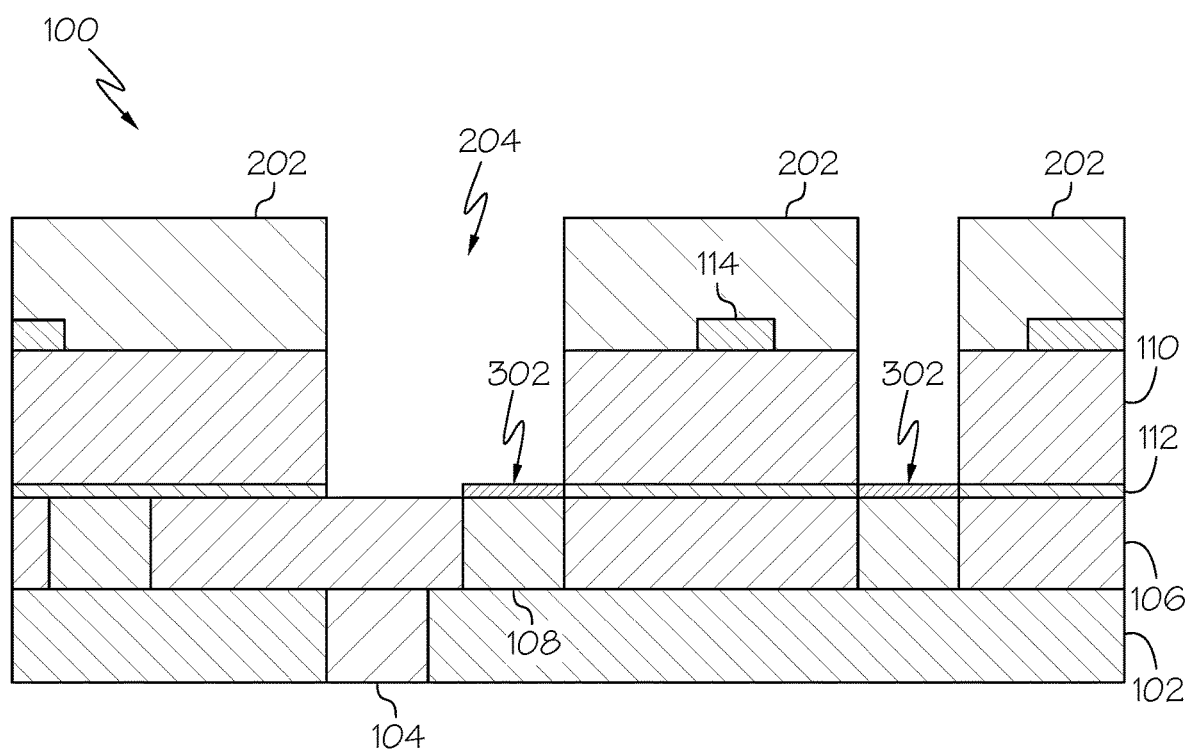
FIG. 3 is a cross-sectional side view of the partial semiconductor structure of FIG. 2 at a subsequent point in the example fabrication process.

As shown in FIG. 3, while the etching patterning mask layer 202 is in place, a metal cap 302 can be selectively formed on the top surface of the metallization contact 108 in the first metallization layer 106. This metal cap 302 can be deposited by physical vapor deposition, chemical vapor deposition, selective chemical vapor deposition, or electroless plating of the metallization contact 108 in the first metallization layer 106. The formation of the metal cap 302 on the metallization contact 108 is an optional step in the semiconductor fabrication process. In various embodiments, a metal cap 302 will not be used on the metallization contact 108. In the current example, the metal cap 302 is selectively formed on the top surface of the metallization contact 108 by electroless plating of the metallization contact 108. According to various embodiments, the metallization contact 108 is made of Cobalt while the metal cap 302 is made of a non-Cobalt metal. For example, the metal cap 302 could be made of Copper. Other types of metal may be used in the metal cap 302.

After performing the vertical directional etching to form the via trench 204, according the example, the remaining layer of photolithography stack (OPL layer) 202, is removed from the top surface of the second metallization layer 110, by using a dry etch process such as an oxygen plasma. In another instance, the photolithography stack (OPL layer) 202 can be removed by using a suitable wet-etchant.

Figure 4:
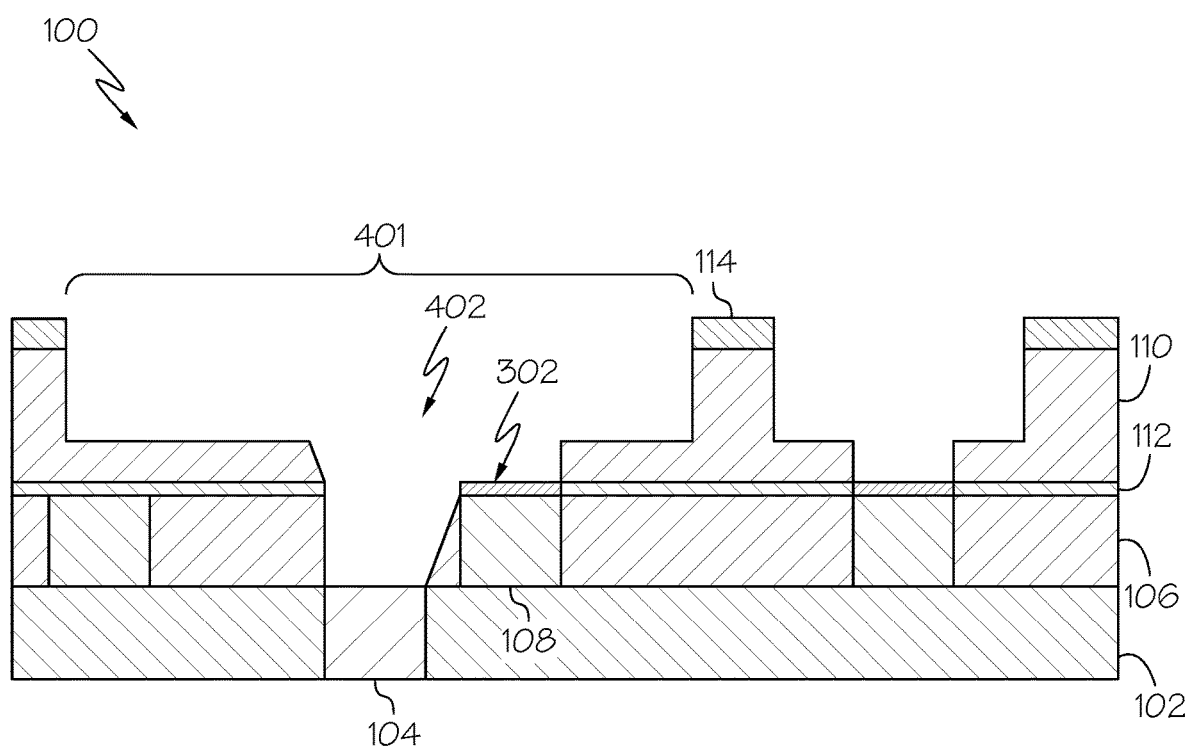
FIG. 4 is a cross-sectional side view of the partial semiconductor structure of FIG. 3 at a subsequent point in the example fabrication process.

Continuing the semiconductor fabrication process with reference to FIG. 4, a metal trench 401 and a via trench 402, inside the metal trench 401, are formed by vertical directional etching such as using a reactive ion etching (RIE) process. The via trench 402 is vertically etched through the first metallization layer 106 to expose a top surface of the semiconductor contact 104 in the top layer 102 of the semiconductor stack. The metal trench 401 is formed by etching the second metallization layer 110, where the second metallization layer 110 is vertically exposed outside of the hard mask 114 protecting the second metallization layer 110 which is directly under the hard mask 114. The metal trench 401 extends horizontally in the second metallization layer 110 at least across the etched via trench 402 and the metal cap 302 on the metallization contact 108 in the first metallization layer 106. The metal trench 401 extends horizontally over the semiconductor contact 104 in the top layer 102 of the semiconductor stack and over the metallization contact 108 in the first metallization layer 106.

The vertical directional etching process, according to the example, may be followed by a wet cleaning process to clean the exposed surfaces in the vertical trench opening 401 and the vertical via opening 402. The wet cleaning may or may not include dilute hydrofluoric acid (DHF) and/or chemistries containing oxidizers, such as peroxides. The non-cobalt metal cap 302 protects the underlying Cobalt metal in the cobalt contact 108 from the oxidizing chemicals used in the wet cleaning process.

Figure 5:
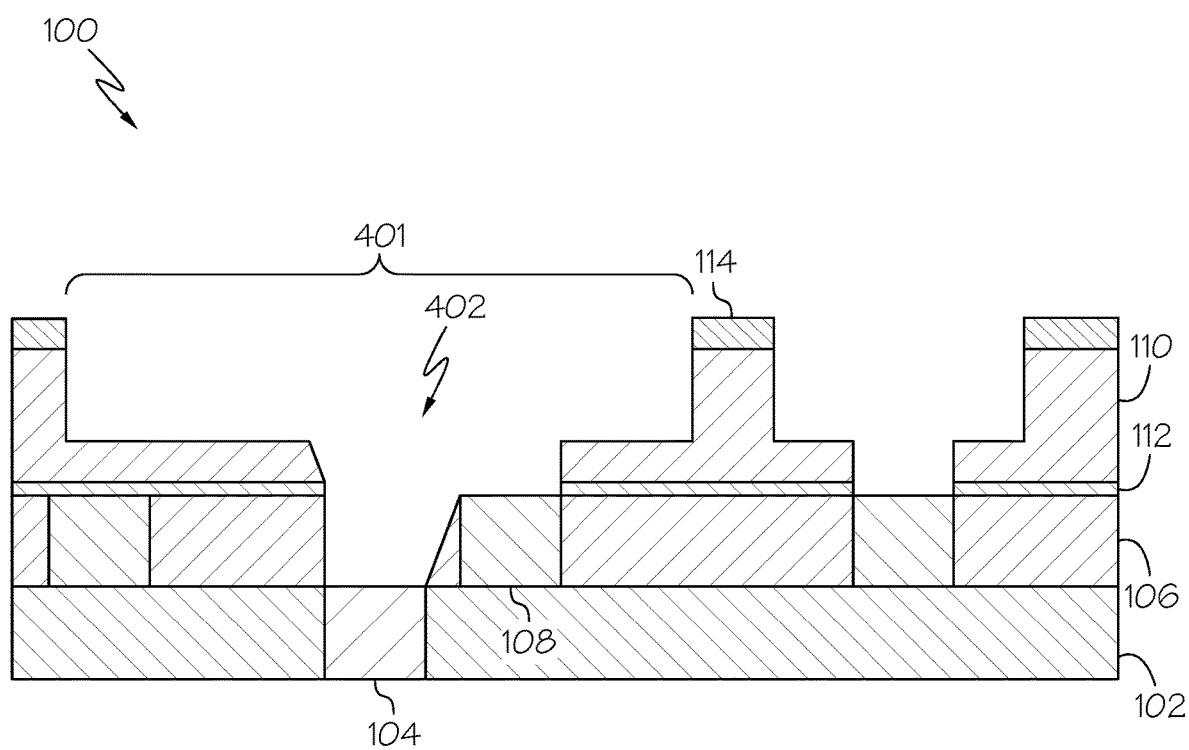
FIG. 5 is a cross-sectional side view of the partial semiconductor structure of FIG. 4 at a subsequent point in the example fabrication process.

As shown in the example of FIG. 5, the semiconductor fabrication process may remove the metal cap 302 exposing the top surface of the metallization contact 108 in the metallization layer 106. In certain embodiments which do not include the optional metal cap 302 formed on the metallization contact 108, this step would be omitted. In certain embodiments in which the metal cap 302 remains in the final semiconductor structure 100, the metal cap 302 is interposed between the metallization contact 108 in the first metallization layer and the electrical interconnect of the super viabar structure 602 in the second metallization layer 110. Also, according to the example, the hard mask 114 layer is removed from the top surface of the second metallization layer 110. In another instance, the hard mask 114 layer can be removed, for example, by using a suitable wet-etchant.

Figure 6:
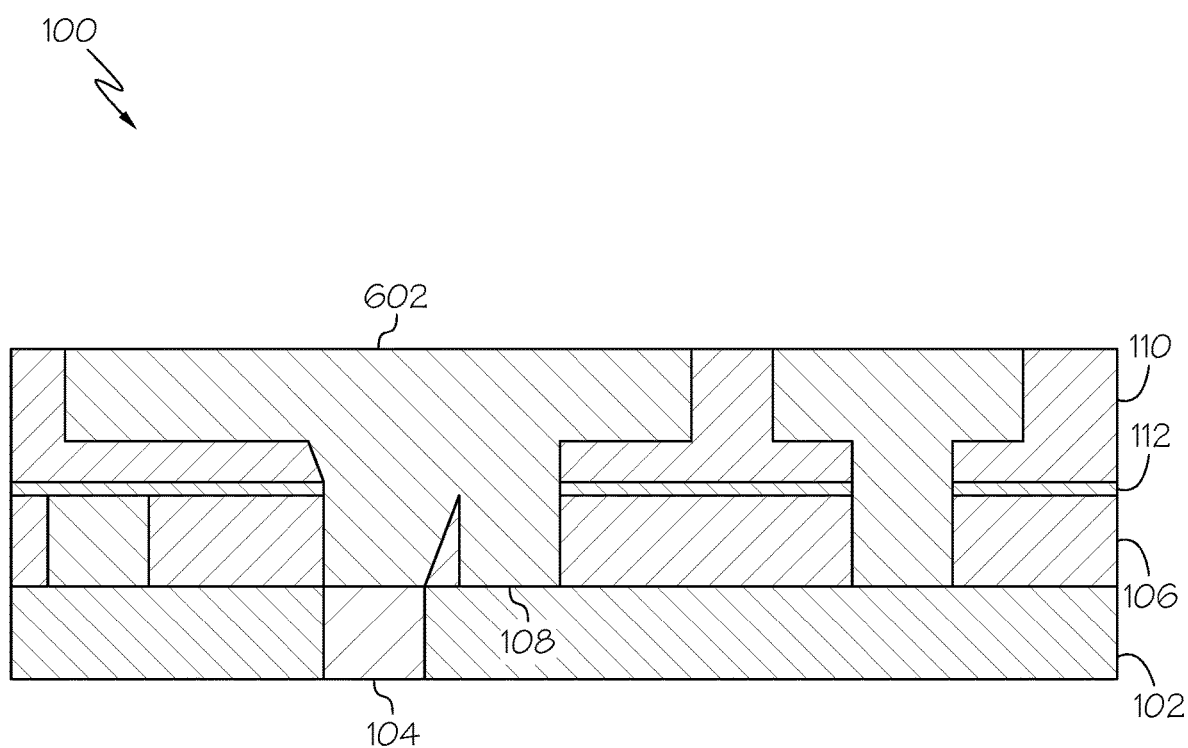
FIG. 6 is a cross-sectional side view of the partial semiconductor structure of FIG. 5 at a subsequent point in the example fabrication process.

With reference to FIGS. 5 and 6, the example fabrication process continues by optionally forming a conductive liner/barrier film (not shown) directly on the exposed surfaces in the vertical trench opening 401 and the vertical via opening 402. Additionally, the conductive liner/barrier film is formed on the top surface of the second metallization layer 110.

The conductive liner/barrier film can include, for example, a Tantalum Nitride film deposited and formed across the walls of the vertical trench opening 401 and the vertical via opening 402. The liner/barrier film can be, for example, a conformal Tantalum Nitride, a TaN/Ta bilayer, a Ti or TiN layer, a Co layer, or a Ru layer, or combinations of these materials deposited on the walls of the vertical trench opening 401 and the vertical via opening 402. The liner/barrier film deposition, according to the example, is primarily by a physical vapor deposition (PVD) technique, though processes such as ALD or CVD can be used as well. The deposition process should be performed such that it deposits material on the sidewalls of the vertical trench opening 401 and the sidewalls of the vertical via opening 402.

After the optional deposition of the liner/barrier film into the vertical trench opening 401 and the vertical via opening 402, a deposition of a metal gap fill, forms a trench metal super viabar 602 in the vertical trench opening 401 and the vertical via opening 402. This metal super viabar 602 completes the metallization of an interconnect wire that electrically connects the semiconductor contact 104 in the top layer of the semiconductor stack to the metallization contact 108 in the first metallization layer 106. The metal super viabar 602 provides the interconnect wire that passes through the second metallization layer 110 to electrically connect the two contacts, i.e., the semiconductor contact 104 and the metallization contact 108. The metal super viabar 602 is located above the first metallization layer 106 and the top layer 102 of the semiconductor stack.

In this example, this is a metal gap fill 602 deposited by PVD Copper seed followed by Copper plating, though chemical vapor deposition (CVD) techniques could be used as well. The metal gap fill 602 can include any metal suitable for forming the trench metal super viabar 602 on the conductive liner/barrier film in the vertical trench opening 401 and the vertical via opening 202, as shown in FIG. 6. For example, the trench metal super viabar 602 can be made of Copper metal. Several examples of metal that can be used as the metal gap fill include: Copper, Cobalt, Ruthenium, Tungsten, or any combination thereof. However, other metals could also, or alternatively, be used in the trench metal super viabar 602, as shown in the example of FIG. 6.

There will be a certain overburden of metal on top of the wafer from the CVD deposition of the metal fill. Some of the conductive liner/barrier film may have been formed on the top surface of the wafer. The semiconductor fabrication process, according to the example, performs a chemical mechanical planarization (CMP) process that polishes and removes the excess metal from the top of the wafer. In the present example, the CMP process also removes the liner/barrier film from the top surface of the second metallization layer 110 of the material stack 102, 106, 112, 110, shown in FIG. 6. In the final structure, according to the certain embodiments that include a conductive liner/barrier, the conductive liner/barrier film will solely be present in the vertical trench opening 401 and in the vertical via opening 402. The resulting semiconductor structure 100, after performing the CMP process in the present example fabrication process, is shown in FIG. 6.

Figure 7:
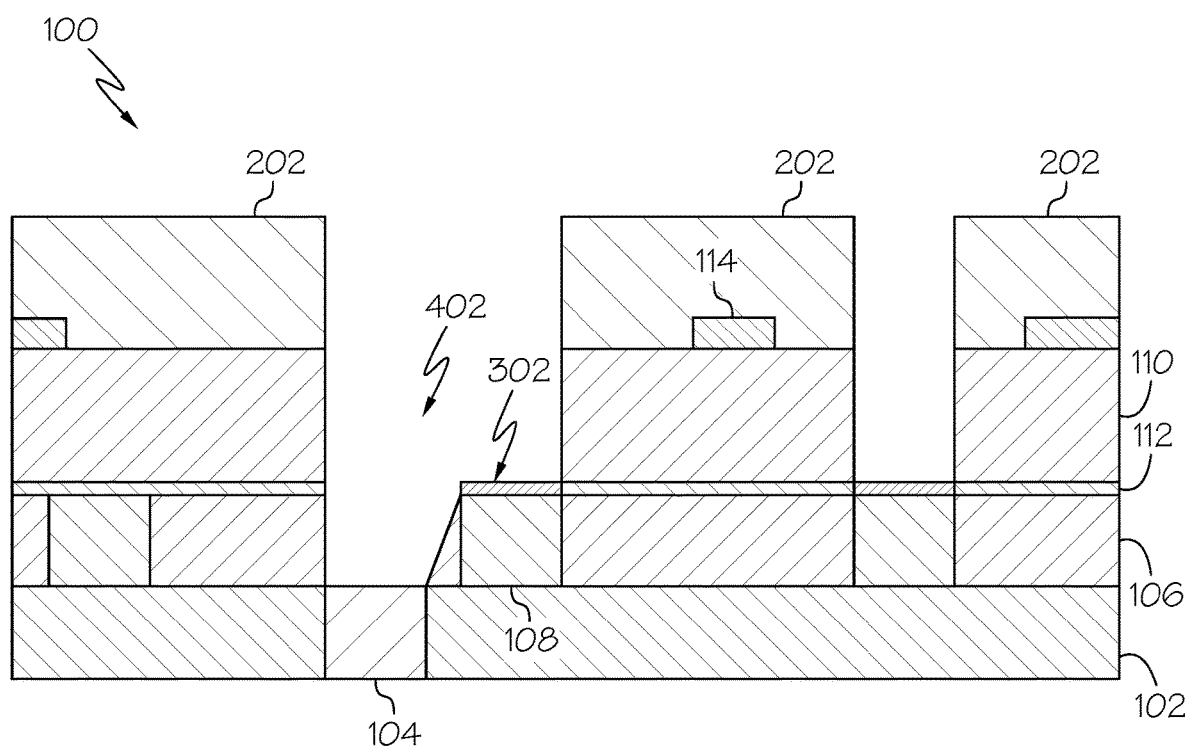
FIG. 7 is a cross-sectional side view of a partial semiconductor structure at a point in an example fabrication process, according to various embodiments of the invention.

A second example semiconductor fabrication process generally includes the process steps shown in FIGS. 1 to 2, and as discussed above. Then, the fabrication process proceeds according to FIG. 7, instead of FIG. 3. In this second example fabrication process, after forming the via trench 204 as shown in FIGS. 2 and 7, and while the etching patterning mask layer 202 is in place, the metal cap 302 can be selectively formed on the top surface of the metallization contact 108 in the first metallization layer 106. As discussed above with respect to the first example fabrication process, the metal cap 302 can be deposited by physical vapor deposition, chemical vapor deposition, selective chemical vapor deposition, or electroless plating of the metallization contact 108 in the first metallization layer 106. The formation of the metal cap 302 on the metallization contact 108 is an optional step in the semiconductor fabrication process. In various embodiments, a metal cap 302 will not be used on the metallization contact 108. In the current example, the metal cap 302 is selectively formed on the top surface of the metallization contact 108 by electroless plating of the metallization contact 108. In this second example process, the semiconductor contact 104 can be made with Tungsten metal material or with Copper metal material. The metallization contact 108 can be made with Tungsten metal material or with Copper metal material.

Then, as shown in FIG. 7, the via trench 402 is formed by vertical directional etching through the first metallization layer 106 to expose a top surface of the semiconductor contact 104 in the top layer 102 of the semiconductor stack. After performing the vertical directional etching to form the via trench 204, according the example, the remaining layer of photolithography stack (OPL layer) 202, is removed from the top surface of the second metallization layer 110, by using a dry etch process such as an oxygen plasma. In another instance, the photolithography stack (OPL layer) 202 can be removed by using a suitable wet-etchant.

Then, continuing with the fabrication process as shown in FIG. 4, the metal trench 401 is formed by vertical directional etching such as using a reactive ion etching (RIE) process. The metal trench 401 is formed by etching the second metallization layer 110, where the second metallization layer 110 is vertically exposed outside of the hard mask 114 protecting the second metallization layer 110 which is directly under the hard mask 114. The metal trench 401 extends horizontally in the second metallization layer 110 at least across the etched via trench 402 and the metal cap 302 on the metallization contact 108 in the first metallization layer 106. The metal trench 401 extends horizontally over the semiconductor contact 104 in the top layer 102 of the semiconductor stack and over the metallization contact 108 in the first metallization layer 106.

The second example semiconductor fabrication process then continues with steps shown in FIGS. 5 and 6 and discussed above. The resulting semiconductor structure 100 is shown in FIG. 6.

A third example semiconductor fabrication process generally includes process steps similar to those discussed above for the second example semiconductor fabrication process. The semiconductor contact 104 and the metallization contact 108, in this third example fabrication process, are made with the same metal material. For example, both contacts can be made of Cobalt metal. In various embodiments both contacts could be made of the same metal material other than Cobolt metal, such as, but not limited to, Copper, Tungsten, or Ruthenium. The metal cap 302, in this example can be made of a non-Cobalt metal material such as Copper metal. The super viabar is also made of Copper metal.

According to a fourth example semiconductor fabrication process, after performing the process steps shown in FIGS. 1 and 2, and as discussed above, the fabrication process continues according to FIGS. 8 to 14. After performing the vertical directional etching to form the via trench 204, according the example, the remaining layer of photolithography stack (OPL layer) 202, is removed from the top surface of the second metallization layer 110, by using a dry etch process such as an oxygen plasma. In another instance, the photolithography stack (OPL layer) 202 can be removed by using a suitable wet-etchant.

Figure 8:
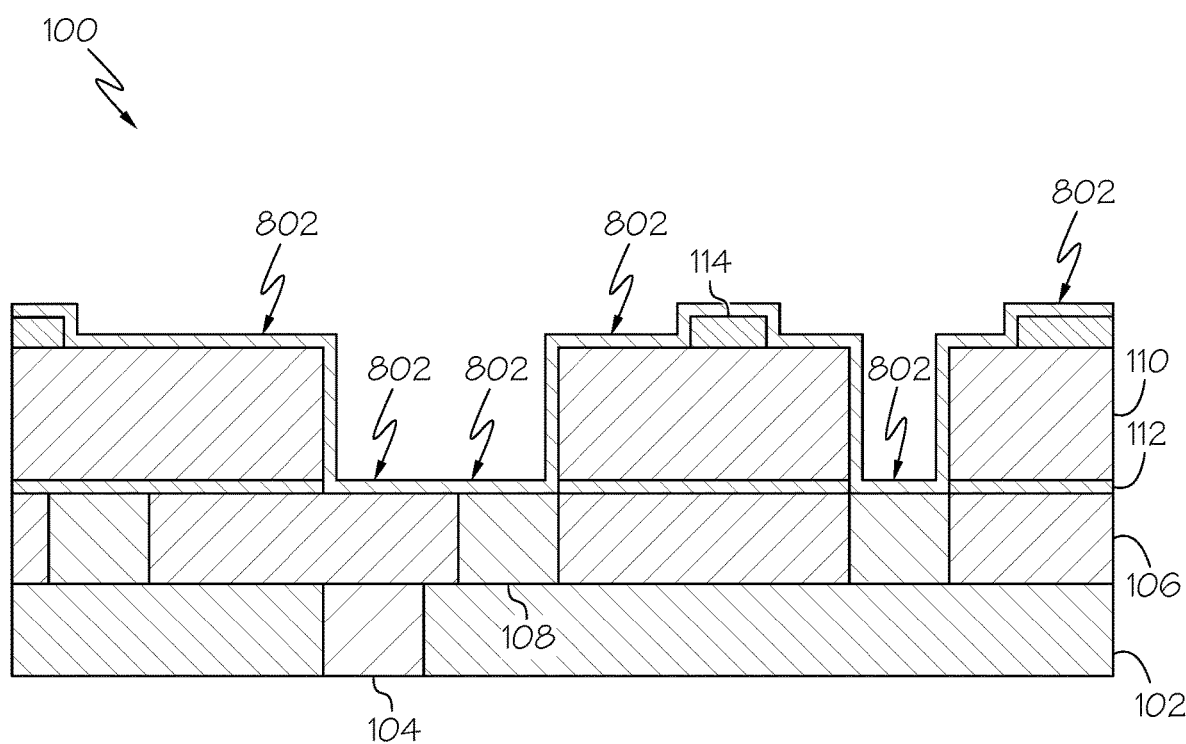
FIG. 8 is a cross-sectional side view of a partial semiconductor structure at a point in an example fabrication process, according to various embodiments of the invention.
Figure 9:
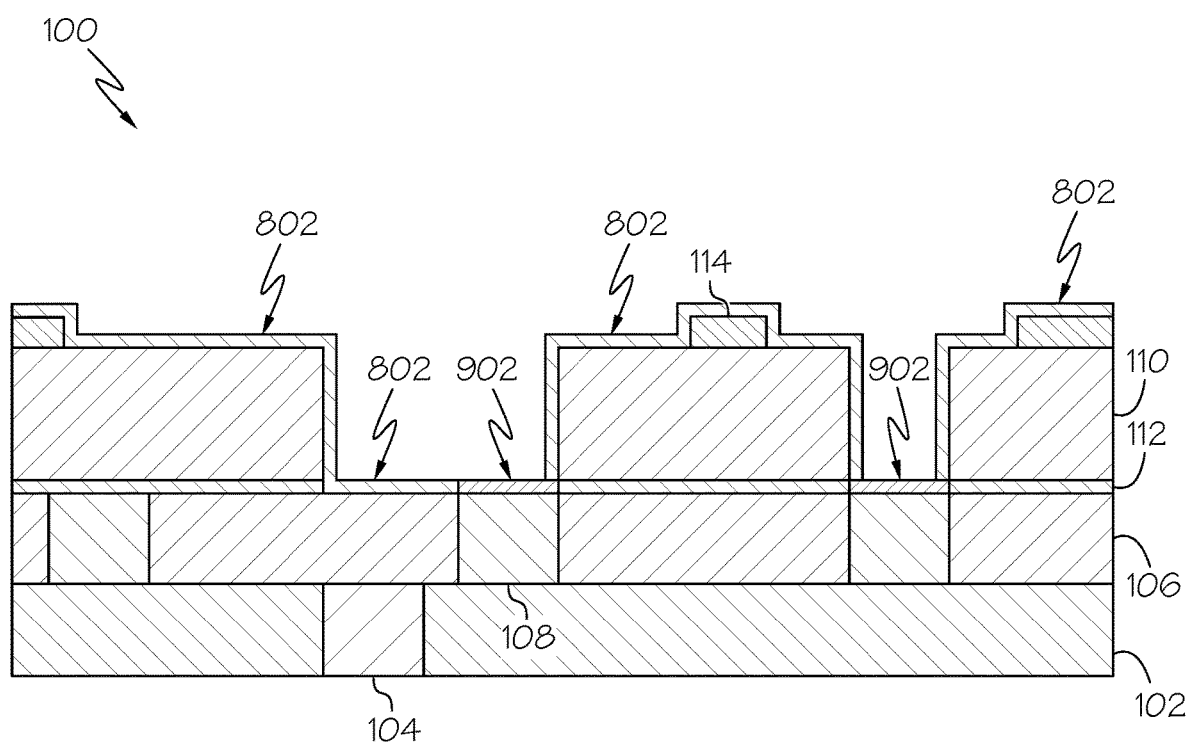
FIG. 9 is a cross-sectional side view of the partial semiconductor structure of FIG. 8 at a subsequent point in the example fabrication process.
Figure 10:
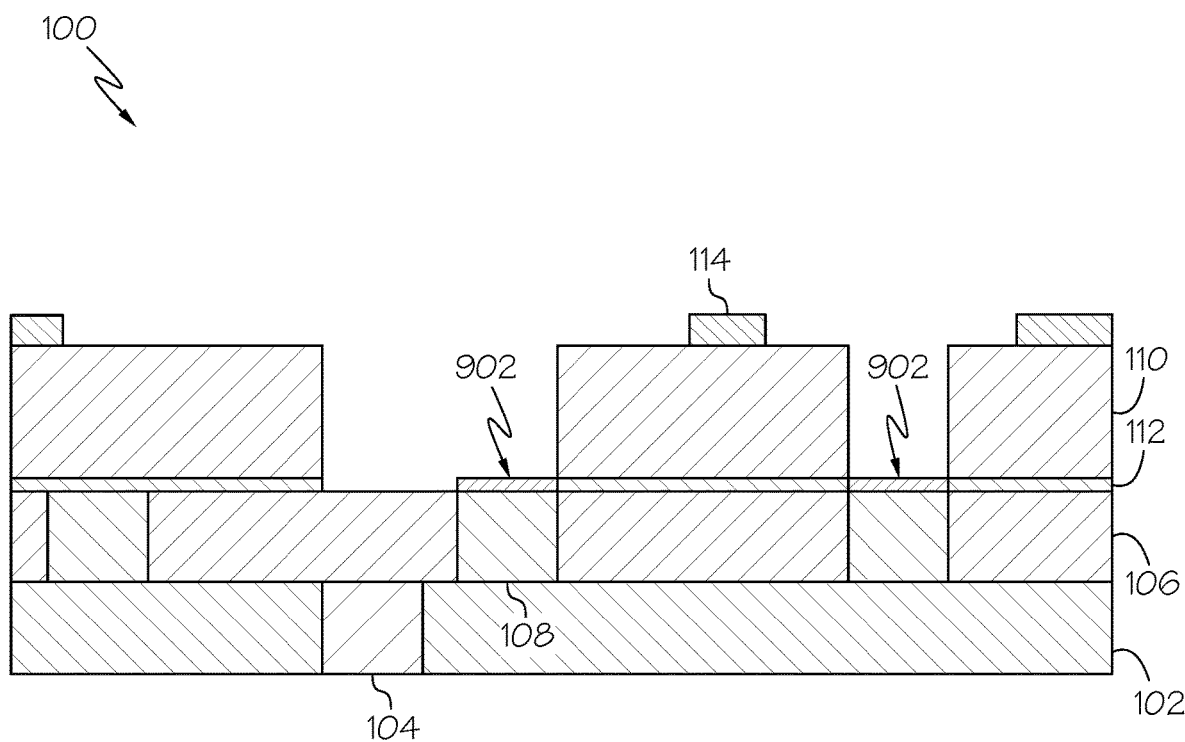
FIG. 10 is a cross-sectional side view of the partial semiconductor structure of FIG. 9 at a subsequent point in the example fabrication process.
Figure 11:
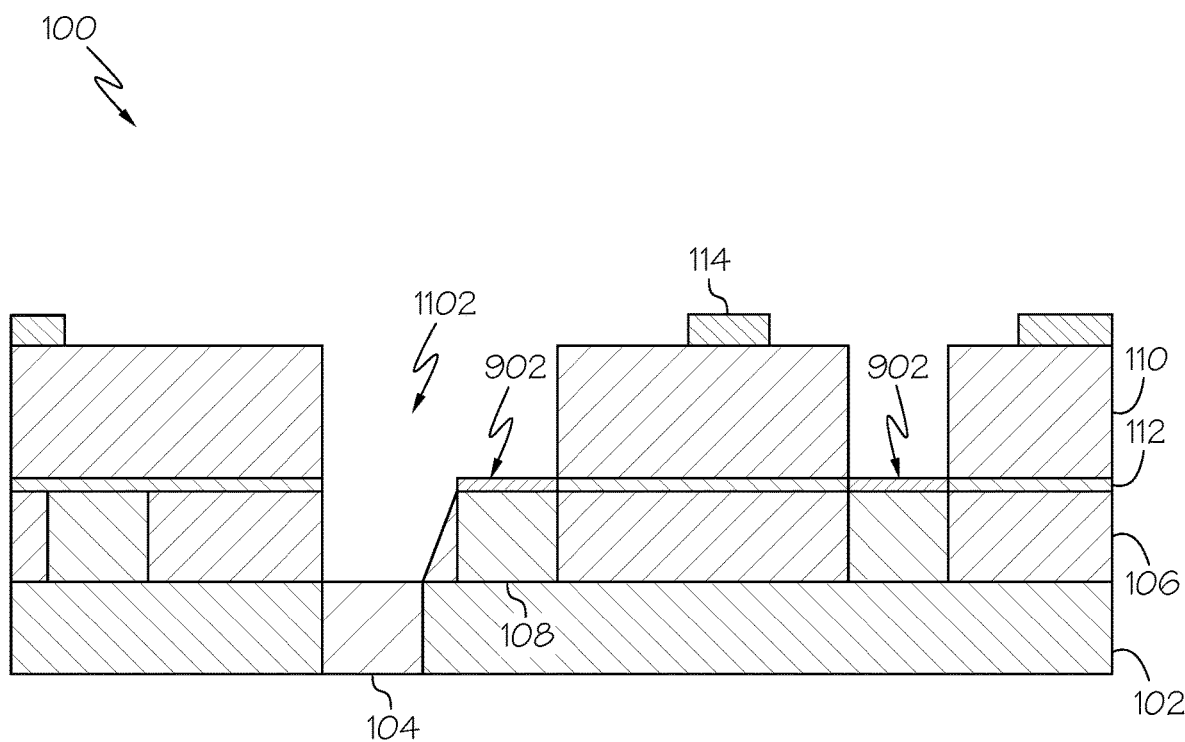
FIG. 11 is a cross-sectional side view of the partial semiconductor structure of FIG. 10 at a subsequent point in the example fabrication process.

Then, as shown in FIG. 8, a blanket deposition of metal cap material 802 is performed. The metal cap material, in this fourth example, is a non-Cobalt metal material, such as Copper or Ruthenium. This metal cap material, according to the example, can be deposited by PVD, CVD, selective-CVD, or electroless plating. FIG. 8 shows a blanket PVD deposition process for depositing the metal cap material 802, as shown. This blanket deposition is followed by thermal treatment of the semiconductor structure 100 to form metal alloy 902 selectively on the vertically exposed top surface of the first metallization layer and the second metallization layer. The temperature of the treatment can be at least 300 degrees Celsius, or higher, which is sufficient to form a metal alloy 902 from the metal cap material 802 deposited on top of the metallization contact 108. The metal cap material 802 deposited on the dielectric cap layer 112 and on the top surface of the second metallization layer 110, based on the thermal treatment The metal cap material 802, in response to the thermal treatment, reacts with the dielectric cap layer material 112. Then, the metal cap material 802 can be removed selectively to the metal of the metallization contact 108. The metal cap material 802 will be removed, except where it has turned into a metal alloy 902. Compare FIG. 10 to FIG. 9. After removal of the metal cap material 802, the metallization contact 108 remains covered by the metal alloy 902.

The fabrication process continues, according to this fourth example, by performing vertical directional etching to form a via trench 1102 through the first metallization layer 106, which exposes a top surface of the semiconductor contact 104 in the top layer 102 of the semiconductor stack. The via trench 1102 can be formed by using a reactive ion etching (RIE) process.

Figure 12:
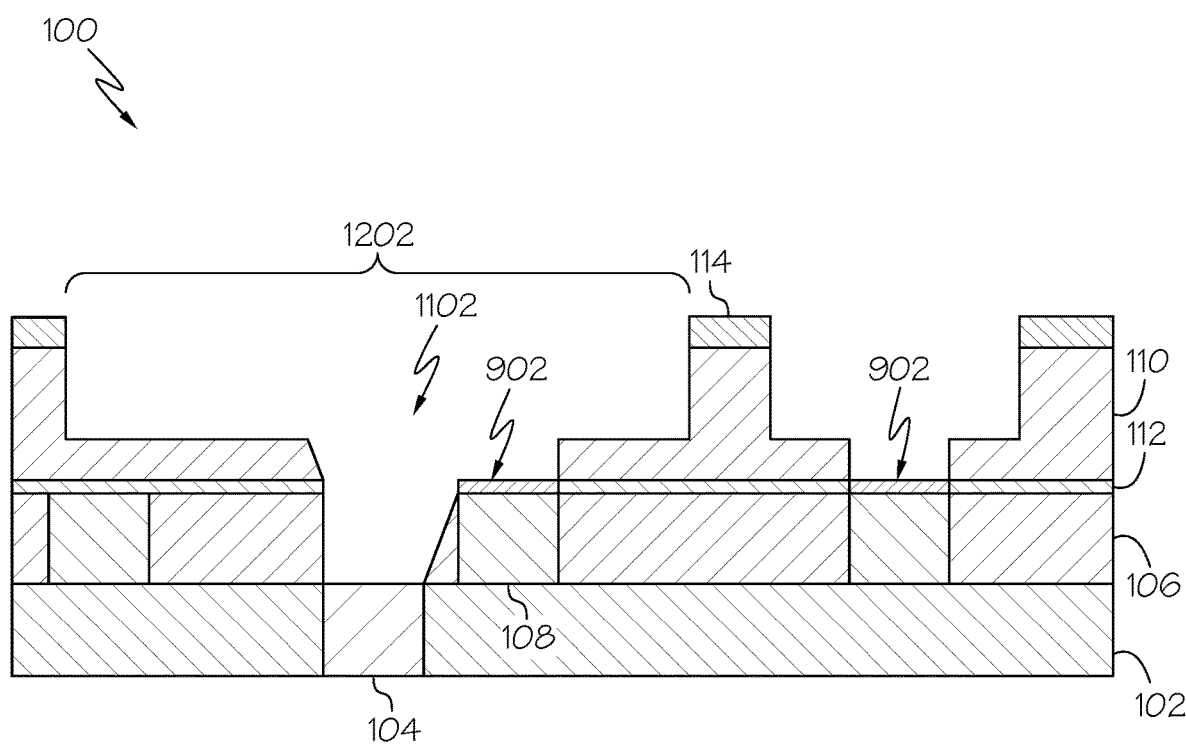
FIG. 12 is a cross-sectional side view of the partial semiconductor structure of FIG. 11 at a subsequent point in the example fabrication process.

As shown in FIG. 12, the example fabrication process then performs vertical directional etching, such as using an RIE process, to form a metal trench 1202 in the second metallization layer 110. This process step is similar to that which has been discussed above with respect to the second example fabrication process shown in FIG. 7 followed by FIG. 4.

The metal trench 1202 is formed by vertical directional etching such as using a reactive ion etching (RIE) process. The metal trench 1202 is formed by etching the second metallization layer 110, where the second metallization layer 110 is vertically exposed outside of the hard mask 114 protecting the second metallization layer 110 which is directly under the hard mask 114. The metal trench 1202 extends horizontally in the second metallization layer 110 at least across the etched via trench 1102 and the metal cap 902 on the metallization contact 108 in the first metallization layer 106. The metal trench 401 extends horizontally over the semiconductor contact 104 in the top layer 102 of the semiconductor stack and over the metallization contact 108 in the first metallization layer 106.

Figure 13:
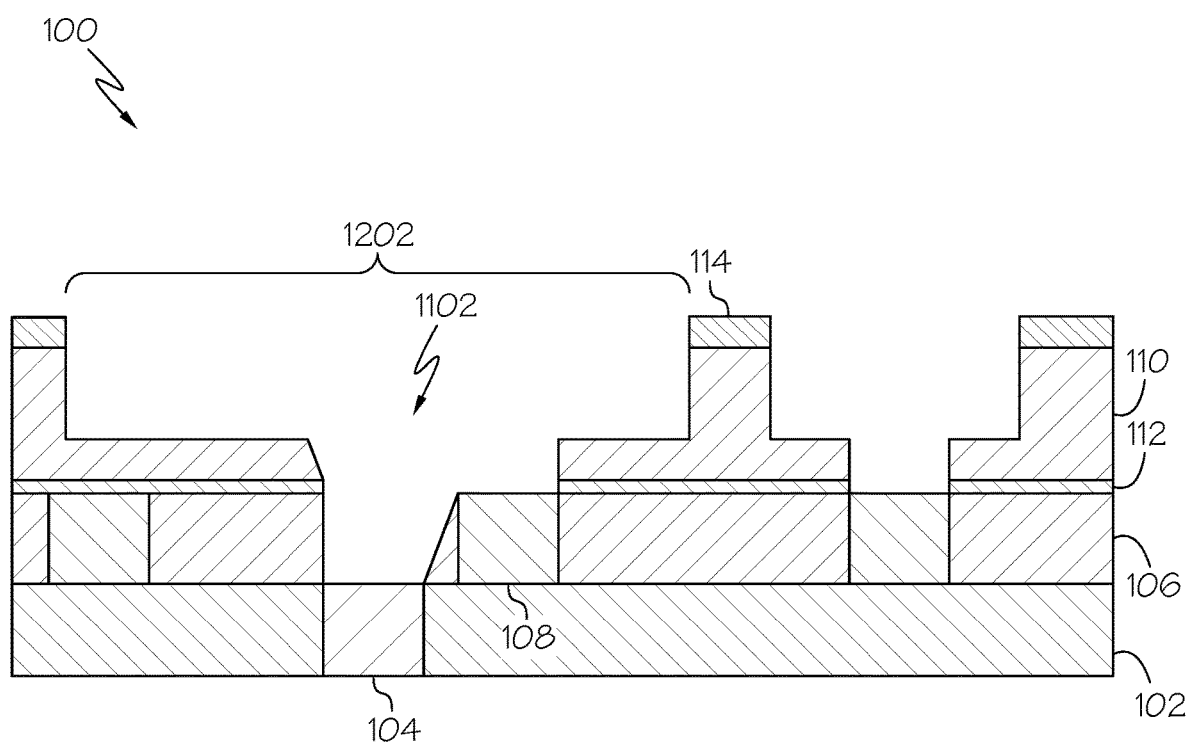
FIG. 13 is a cross-sectional side view of the partial semiconductor structure of FIG. 12 at a subsequent point in the example fabrication process.

As shown in FIG. 13, the semiconductor fabrication process removes the metal cap 902 exposing the top surface of the metallization contact 108 in the metallization layer 106. In certain embodiments which do not include the optional metal cap 902 formed on the metallization contact 108, this step would be omitted. Also, according to the example, the hard mask 114 layer is removed from the top surface of the second metallization layer 110. In another instance, the hard mask 114 layer can be removed, for example, by using a suitable wet-etchant.

Figure 14:
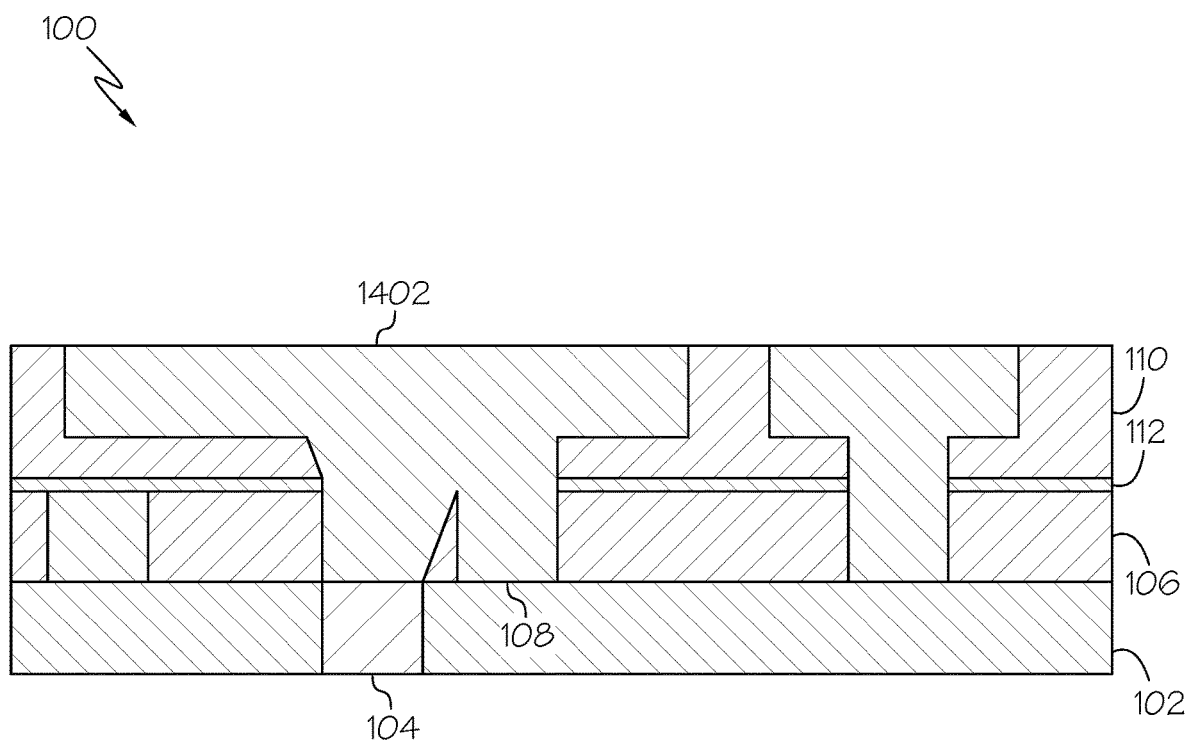
FIG. 14 is a cross-sectional side view of the partial semiconductor structure of FIG. 13 at a subsequent point in the example fabrication process.

As shown in FIGS. 13 and 14, the semiconductor fabrication process can optionally deposit a conductive liner/barrier film on the exposed surfaces in the vertical trench opening 1202 and the vertical via opening 1102. After the optional deposition of the liner/barrier film into the vertical trench opening 1202 and the vertical via opening 402, a deposition of a metal gap fill, forms a trench metal super viabar 1402 in the vertical trench opening 1202 and the vertical via opening 1102. This metal super viabar 602 completes the metallization of an interconnect wire that electrically connects the semiconductor contact 104 in the top layer of the semiconductor stack to the metallization contact 108 in the first metallization layer 106. The metal super viabar 1402 provides the interconnect wire that passes through the second metallization layer 110 to electrically connect the two contacts, i.e., the semiconductor contact 104 and the metallization contact 108. The metal super viabar 1402 is located above the first metallization layer 106 and the top layer 102 of the semiconductor stack.

In this example, this is a metal gap fill 1402 deposited by PVD Copper seed followed by Copper plating, though chemical vapor deposition (CVD) techniques could be used as well. The metal gap fill 1402 can include any metal suitable for forming the trench metal super viabar 1402 on the conductive liner/barrier film in the vertical trench opening 1202 and the vertical via opening 1102, as shown in FIG. 14. For example, the trench metal super viabar 1402 can be made of Copper metal. Several examples of metal that can be used as the metal gap fill include: Copper, Cobalt, Ruthenium, Tungsten, or any combination thereof. However, other metals could also, or alternatively, be used in the trench metal super viabar 1402, as shown in the example of FIG. 14.

There will be a certain overburden of metal on top of the wafer from the CVD deposition of the metal fill. Some of the conductive liner/barrier film may have been formed on the top surface of the wafer. The semiconductor fabrication process, according to the example, performs a chemical mechanical planarization (CMP) process that polishes and removes the excess metal from the top of the wafer. In the present example, the CMP process also removes the liner/barrier film from the top surface of the second metallization layer 110 of the material stack 102, 106, 112, 110, shown in FIG. 14. In the final structure, according to the certain embodiments that include a conductive liner/barrier, the conductive liner/barrier film will solely be present in the vertical trench opening 1202 and in the vertical via opening 1102. The resulting semiconductor structure 100, after performing the CMP process in the present example fabrication process, is shown in FIG. 14.

Figure 15:
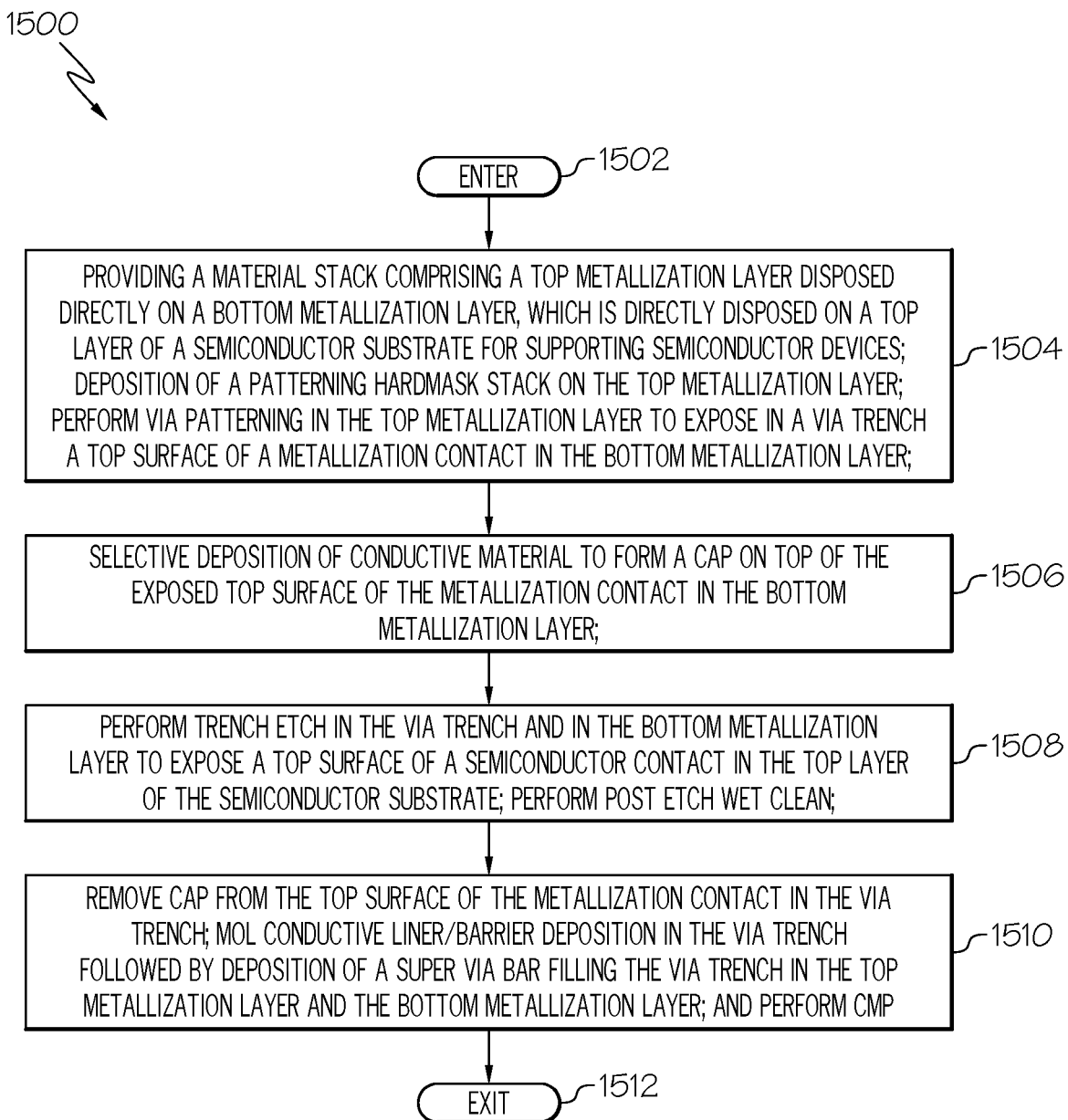
FIG. 15 is an operational flow diagram illustrating an example fabrication process, according to various embodiments of the invention.

In accordance with an example semiconductor fabrication process, as shown in FIG. 15, a fabrication flow diagram is entered, at step 1502, which then immediately proceeds to step 1504. In a metallization region of a semiconductor structure 100 with a substrate for supporting electronic devices, as shown in FIG. 1, provided is a material stack according to one example, comprising a top (second) metallization layer 110 disposed directly on a bottom (first) metallization layer 106, which is directly disposed on a top layer 102 of a semiconductor stack and substrate for supporting semiconductor devices.

The semiconductor fabrication process performs deposition of a patterning hard mask 114 on the top metallization layer 110. The process performs via patterning in the top metallization layer 110 to expose in a via trench a top surface of a metallization contact 108 in the bottom metallization layer 106. The semiconductor fabrication process, at step 1506, performs selective deposition of conductive material to form a metal cap 302 on top of the exposed top surface of the metallization contact 108 in the bottom metallization layer 106.

The fabrication process, at step 1508, performs a trench etch in the via trench and in the bottom metallization layer 106 to expose a top surface of a semiconductor contact 104 in the top layer 102 of the semiconductor substrate. The process then performs post etch wet clean.

Continuing with the process, at step 1510, the metal cap 302 is removed from the top surface of the metallization contact 108 in the via trench. An optional MOL conductive liner/barrier is deposited in the via trench. Metal fill is deposited in the via trench filling the via trench to form a super via bar structure 602 in the top metallization layer 110. The super via bar structure 602 provides an electrical interconnect between the metallization contact 108 and the semiconductor contact 104. The process then performs CMP process on the semiconductor structure 100. An example of the resulting semiconductor structure 100, after performing the CMP process in the present example fabrication process, is shown in FIG. 6. The example semiconductor fabrication process is then exited, at step 1512.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
  a semiconductor stack disposed on a substrate, a top layer of the semiconductor stack including at least one semiconductor contact located in the top layer of the semiconductor stack according to a first horizontal pitch;
  a first BEOL metallization layer disposed directly on the top layer of the semiconductor stack, the first BEOL metallization layer including at least one metallization contact located in the first BEOL metallization layer according to a second horizontal pitch, the second horizontal pitch being different from the first horizontal pitch such that a location of the at least one metallization contact is vertically mismatched from the location of the at least one semiconductor contact; and
  a second BEOL metallization layer disposed directly on the first BEOL metallization layer, the second BEOL metallization layer including a super viabar structure that forms an electrical interconnect, in the second BEOL metallization layer, between the at least one semiconductor contact and the at least one metallization contact.

2. The semiconductor structure of claim 1, wherein the semiconductor stack disposed on the substrate includes a plurality of electronic devices in a circuit disposed on the circuit supporting substrate, a first electronic device in the plurality of electronic devices comprising a first field-effect transistor (FET) and a second electronic device in the plurality of electronic devices comprising a second FET, the super viabar structure providing an electrical interconnect, in the second BEOL metallization layer, between the first FET and the second FET.

3. The semiconductor structure of claim 1, wherein the super viabar structure in the second BEOL metallization layer providing a modular add-on electrical interconnect on top of the first BEOL metallization layer, for interconnecting the vertically mismatched at least one metallization contact in the first BEOL metallization layer with the at least one semiconductor contact in the top layer of the semiconductor stack.

4. The semiconductor structure of claim 1, further comprising:
  a metal cap disposed directly on the at least one metallization contact located in the first BEOL metallization layer, the metal cap being interposed between the at least one metallization contact in the first BEOL metallization layer and the electrical interconnect of the super viabar structure in the second BEOL metallization layer.

5. The semiconductor structure of claim 4, wherein the metal cap is made of a metal alloy.

6. The semiconductor structure of claim 1, wherein the at least one semiconductor contact comprises Tungsten, the at least one metallization contact located in the first BEOL metallization layer comprises Copper, and the super viabar structure in the second BEOL metallization layer comprises Copper.

7. The semiconductor structure of claim 1, wherein the at least one semiconductor contact comprises Cobalt, the at least one metallization contact located in the first BEOL metallization layer comprises Copper, and the super viabar structure in the second BEOL metallization layer comprises Copper.

8. The semiconductor structure of claim 1, wherein the at least one semiconductor contact comprises Cobalt, the at least one metallization contact located in the first BEOL metallization layer comprises Cobalt, and the super viabar structure in the second BEOL metallization layer comprises Cobalt.

9. The semiconductor structure of claim 1, wherein the at least one semiconductor contact comprises Cobalt, the at least one metallization contact located in the first BEOL metallization layer comprises Ruthenium, and the super viabar structure in the second BEOL metallization layer comprises Ruthenium.

10. The semiconductor structure of claim 1, wherein the at least one semiconductor contact comprises Ruthenium, the at least one metallization contact located in the first BEOL metallization layer comprises Cobalt, and the super viabar structure in the second BEOL metallization layer comprises Cobalt.

11. A method for fabricating an electrical contact in a BEOL metallization layer for a semiconductor structure, the method comprising:
  providing a semiconductor stack disposed on a circuit supporting substrate;
  patterning a top layer of the semiconductor stack to provide at least one semiconductor contact located in the top layer of the semiconductor stack according to a first horizontal pitch;
  patterning a first BEOL metallization layer disposed directly on the top layer of the semiconductor stack, to provide at least one metallization contact located in the first BEOL metallization layer according to a second horizontal pitch, the second horizontal pitch being different from the first horizontal pitch such that a location of the at least one metallization contact is vertically mismatched from the location of the at least one semiconductor contact; and
  patterning a second BEOL metallization layer disposed directly on the first BEOL metallization layer, followed by deposition of a metal fill material filling a via trench in the first BEOL metallization layer and the second BEOL metallization layer, to provide a super viabar structure that forms an electrical interconnect, in the second BEOL metallization layer, between the at least one semiconductor contact in the top layer of the semiconductor stack and the at least one metallization contact in the first BEOL metallization layer.

12. The method of claim 11, wherein the super viabar structure in the second BEOL metallization layer is a modular add-on electrical interconnect on top of the first BEOL metallization layer, for interconnecting the vertically mismatched at least one metallization contact in the first BEOL metallization layer with the at least one semiconductor contact in the top layer of the semiconductor stack.

13. The method of claim 11, further comprising:
perform via patterning in the second BEOL metallization layer to expose in a via trench a top surface of the at least one metallization contact in the first BEOL metallization layer;
perform selective deposition of conductive material on the exposed top surface of the at least one metallization contact to form a metal cap on the exposed top surface of the at least one metallization contact;
perform trench etch in the via trench and in the first BEOL metallization layer to expose in the via trench a top surface of the at least one semiconductor contact in the top layer of the semiconductor stack; and
perform deposition of a metal fill material filling the via trench in the first BEOL metallization layer and the second BEOL metallization layer, to form the super viabar structure providing the electrical interconnect, in the second BEOL metallization layer, between the at least one semiconductor contact in the top layer of the semiconductor stack and the at least one metallization contact in the first BEOL metallization layer.

14. The method of claim 13, further comprising:
perform, before the deposition of the metal fill material filling the via trench in the first BEOL metallization layer and the second BEOL metallization layer, removal of the metal cap to expose in the via trench the top surface of the at least one metallization contact in the first BEOL metallization layer.

15. The method of claim 13, wherein the metal cap being disposed directly on the at least one metallization contact located in the first BEOL metallization layer, and the metal cap being interposed between the at least one metallization contact and the electrical interconnect of the super viabar structure in the second BEOL metallization layer.

16. The method of claim 13, wherein the metal cap is made of a metal alloy.

17. The method of claim 13, further comprising:
thermally treating the metal cap, disposed on the top surface of the at least one metallization contact in the first BEOL metallization layer, to form a metal alloy in the metal cap.

18. The method of claim 13, wherein the at least one semiconductor contact comprises at least one metal selected from the following set: Tungsten, Cobalt, and Ruthenium; and
wherein the at least one metallization contact located in the first BEOL metallization layer comprises Cobalt, and the super viabar structure in the second BEOL metallization layer comprises Cobalt.

19. The method of claim 13, wherein the at least one semiconductor contact comprises at least one metal selected from the following set: Tungsten, Cobalt, and Ruthenium; and
wherein the at least one metallization contact located in the first BEOL metallization layer comprises Copper, and the super viabar structure in the second BEOL metallization layer comprises Copper.

20. The method of claim 13, wherein the at least one semiconductor contact comprises at least one metal selected from the following set: Tungsten, Cobalt, and Ruthenium; and
wherein the at least one metallization contact located in the first BEOL metallization layer comprises Ruthenium, and the super viabar structure in the second BEOL metallization layer comprises Ruthenium.

* * * * *